(12) United States Patent
Ono et al.

(10) Patent No.: US 6,660,647 B1
(45) Date of Patent: Dec. 9, 2003

(54) METHOD FOR PROCESSING SURFACE OF SAMPLE

(75) Inventors: Tetsuo Ono, Iruma (JP); Takafumi Tokunaga, Iruma (JP); Tadashi Umezawa, Oume (JP); Motohiko Yoshigai, Hikari (JP); Tatsumi Mizutani, Tokyo (JP); Tokuo Kure, Tokyo (JP); Masayuki Kojima, Tokyo (JP); Takashi Sato, Kudamatsu (JP); Yasushi Goto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/646,012

(22) PCT Filed: Mar. 12, 1999

(86) PCT No.: PCT/JP99/01215

§ 371 (c)(1),
(2), (4) Date: Jan. 11, 2001

(87) PCT Pub. No.: WO99/46810

PCT Pub. Date: Sep. 16, 1999

(30) Foreign Application Priority Data

Mar. 12, 1998 (JP) .......................................... 10-060809
Sep. 10, 1998 (JP) .......................................... 10-256926
Oct. 13, 1998 (JP) .......................................... 10-290293

(51) Int. Cl.[7] .............................................. H01L 21/00
(52) U.S. Cl. .................... 438/714; 156/345.36; 216/67; 216/69; 216/72; 216/75; 216/79; 438/720; 438/721; 438/726; 438/742
(58) Field of Search ............... 156/345.36; 438/714, 438/720, 721, 726, 742; 216/67, 69, 72, 75, 79

(56) References Cited

U.S. PATENT DOCUMENTS

| | | | |
|---|---|---|---|
| 4,579,623 A | 4/1986 | Suzuki et al. | |
| 4,585,516 A | * 4/1986 | Corn et al. | ................. 156/643 |
| 4,808,258 A | 2/1989 | Otsubo et al. | |
| 5,298,112 A | 3/1994 | Hayasaka et al. | |
| 5,352,324 A | 10/1994 | Gotoh et al. | |
| 5,376,211 A | 12/1994 | Harada et al. | |
| 5,494,522 A | 2/1996 | Moriya et al. | |
| 5,593,539 A | 1/1997 | Kubota et al. | |
| 5,614,060 A | 3/1997 | Hanawa | |
| 5,625,526 A | 4/1997 | Watanabe et al. | |
| 5,779,925 A | 7/1998 | Hashimoto et al. | |
| 5,983,828 A | 11/1999 | Savas | |
| 6,093,332 A | 7/2000 | Winniczek et al. | |
| 6,129,806 A | 10/2000 | Kaji et al. | |

FOREIGN PATENT DOCUMENTS

| | | | |
|---|---|---|---|
| JP | 60-50923 | | 3/1985 |
| JP | 60-169824 | * | 9/1985 |
| JP | 62-154734 | | 7/1987 |
| JP | 62-249421 | * | 10/1987 |
| JP | 04-148534 | * | 5/1992 |
| JP | 4-54373 | | 8/1992 |
| JP | 6-151360 | | 5/1994 |
| JP | 6-85396 | | 10/1994 |
| JP | 07-94492 | * | 4/1995 |
| JP | 08-316207 | * | 11/1996 |
| JP | 8-339989 | | 12/1996 |
| JP | 09-199485 | * | 7/1997 |
| JP | 10-135192 | * | 5/1998 |

\* cited by examiner

Primary Examiner—William A. Powell
(74) Attorney, Agent, or Firm—Antonelli, Terry, Stout & Kraus, LLP

(57) ABSTRACT

A surface processing method of a sample having a mask layer that does not contain carbon as a major component formed on a substance to be processed, the substance being a metal, semiconductor and insulator deposited on a silicon substrate, includes the steps of installing the sample on a sample board in a vacuum container, generating a plasma that consists of a mixture of halogen gas and adhesive gas inside the vacuum container, applying a radio frequency bias voltage having a frequency ranging from 200 kHz to 20 MHz on the sample board, and controlling a periodic on-off of the radio frequency bias voltage with an on-off control frequency ranging from 100 Hz to 10 kHz.

14 Claims, 8 Drawing Sheets

(PRIOR ART)

(a)  (b)

(PRIOR ART)

(a)  (b)

METHOD FOR PROCESSING SURFACE OF SAMPLE

FIELD OF TECHNOLOGY

The present invention relates to the semiconductor surface treatment method, particularly to etching of the semiconductor surface using plasma.

BACKGROUND OF THE INVENTION AND RELATED ART STATEMENT

A device of etching the semiconductor in plasma has been known as a means of treating the semiconductor surface. The following describes the prior art with reference to a device based on the ECR (electron cyclotron resonance) method. This is the method to generate plasma through microwaves in a vacuum container where magnetic field is applied from outside. The magnetic field causes electron to perform cyclotron movement, and this frequency and that of the microwaves are made to resonate with each other, thereby ensuring effective generation of plasma. Radio frequency voltage is applied to the sample in order to accelerate ion incident upon a sample such as a semiconductor device. Halogen gas such as chlorine and fluorine is used as a gas to become plasma.

Such a conventional device is disclosed in Japanese Patent Laid-Open No. 151360/1994 (corresponding Specifications of U.S. Pat. No. 5,352,324) mainly to increase the processing accuracy. According to this invention, selectivity between silicon (Si) as a substance to be etched and substrate oxide film is increased and dependency on aspect ratio is reduced by intermittent on/off control of the radio frequency voltage applied to the sample. Japanese Patent Laid-Open No. 339989/1996 (corresponding Specifications of U.S. Pat. No. 5,614,060) discloses that etching residues can be reduced in metal etching by superimposition of short pulses of intermittent RF bias power. Japanese Patent Laid-open No. 154734/1987 shows a method of processing inclined portions, wherein d.c. bias higher than the specified potential and lower d.c. bias than that are applied alternately by introduction of gas causing deposition and etching.

Japanese Patent Laid-open No. 50923/1985 (corresponding Specifications of U.S. Pat. No. 4,579,623) discloses a method of improving the surface treatment characteristics by periodic change of the volume of etching gas to be introduced and change of radio frequency voltage application time. Furthermore, Japanese Official Gazette No. 69415/1992 (corresponding Specifications of U.S. Pat. No. 4,808,258) discloses a method of improving etching characteristics by changing the radio frequency voltage applied to the sample. Still further, U.S. Pat. No. 4,585,516 discusses a method of improving a uniform etching rate inside the wafer surface by changing the radio frequency voltage of at least one of the radio frequency power supplies connected to two of three electrodes in a three-electrode etching device. Conductive portions of the electrode and wiring of the LSI (Large Scale Integrated circuit) are required to have a lower resistance by higher speed and lower power consumption in recent years. One of the solutions to meet this requirement is a way of using tungsten and other metals to form the gate electrode of the MOS (Metal Oxide Semiconductor) device which where polycrystalline silicon has been used conventionally. Since the current technology is not sufficient to form metallic film directly on the oxide film, this method provides a way of forming polycrystalline silicon film on the oxide film, and forming metal film thereon. This method is attracting attention as one of the most promising methods. Furthermore, a barrier film such as titanium nitride is required to minimize diffusion between the polycrystalline silicon film and metallic film. Without barrier film, polycrystalline silicon and metal will be mixed by dispersion due to heating process after film formation, resulting in higher resistance.

Etching of the film with multilayer architecture as discussed above raises new problems which are caused by etching reaction between the polycrystalline silicon and metal. For example, the optimum values are different between the metal and polycrystalline silicon, so sample temperature is set at an intermediate value. Then metal or barrier film remain unevenly on the polycrystalline silicon, causing irregularities on the etching surface. Higher speed and lower power consumption in recent years require CMOS (Complementary Metal Oxide Semiconductor) to be produced in a dual gate architecture where polycrystalline silicon as a gate electrode on the pMOS side is doped into a p-architecture, and that on the nMOS side is doped in a n-type.

Etching of the film with gate electrodes having different conductivities involves unprecedented issues. For example, increase in the number of photolithographic processes to perform independent etching of p-type and n-type gates will result in higher production costs. This will require simultaneous etching of both p- and n-type gates. However, simultaneous etching of both p- and n-type gates will cause earlier exposure of the underlying gate oxide film on the n-type side since the etching rate of the n-type polycrystalline silicon is higher; this will result in a thinner oxide film on the n-type side or separation of oxide film on the n-type side. Besides, side etching is more likely to occur in the n-type gate Miniaturization of semiconductor devices in recent years has come to require higher precision in processing. One of the ensuing problems to be solved relates to the mask to form very small patterns. A resist as an organic substance is mainly used as a mask material. However, the resist normally has a thickness of about 1 micron. So the resist itself provides a groove with a higher aspect ratio, resulting in more difficult processing of a narrow groove. If the resist is made thinner, it will be no further resist left before underling processing completes. Solution to this problem is provided by the method of using as mask material an inorganic substance including oxide film called a hard mask. The oxide film has five times as durable as the resist, and allows its thickness to be reduced to one fifth or more. This increases the selectivity of the etched material and mask over that when the resist is used; this is a substantial improvement. However, processing of a very thin hard mask involves a new problem of requesting further improvement of the selectivity between the underlying substance as an etched material and hard mask.

Meanwhile, processing dimensions for the line and space corresponding to wiring and electrodes are placed on the level of 1 micron or less, or preferably 0.5 micron or less as a result of miniaturization of semiconductor devices. In the processing of such minute patterns, the line is gradually increased in thickness and the pattern cannot be designed to have the design dimensions. This will create a serious issue. Furthermore, in addition to the differences of etching rate inside the minute groove and on the wider portion, differences in shape, so-called microloading will present a serious issue, which will cause processing failure.

Furthermore, the oxide film of said MOS transistor gate is 6 nm thick or less in the memory device of 256M or thereafter. In such a device, a trade-off relationship is established in selectivity between anisotropy and underlying oxide film, and this makes processing more difficult. Many of said prior arts were invented when the minimum processing dimensions of the element is 1 micron or more. These inventions are finding it difficult to cope with processing of more minute elements. Processing of such minute elements requires assembling under compact process conditions based on analysis of the relationship between the physical volume of plasma and etching characteristics, and many manufacturers are currently spending a lot of time and labor in this direction. The constructed process permits new devices of different quality to be processed.

SUMMARY OF THE INVENTION

The first object of the present invention is to solve these problems by providing a surface processing method which, in etching of the multilayer film comprising metal and polycrystalline silicon, allows a flat surface to be etched without irregularities remaining on the etched surface, and permits the multi layer film to be etched without underlying oxide film etched through.

The second object of the present invention is to solve these problems by providing a surface processing method which, in a simultaneous etching in the presence of gate electrodes of different conductivity, allows differences in processing shape to be minimized without the oxide film of the underlying gate etched through.

The third object of the present invention is to provide a surface processing method which allows the selectivity between the etched substance and mask material to be increased in the surface processing of semiconductor or the like.

The fourth object of the present invention is to provide a semiconductor device surface treatment method and a system thereof which capable of processing a device having a processing dimension not exceeding 1 micron, or preferably not exceeding 0.5 micron to meet the requirements for miniaturization of semiconductor devices.

To solve above-mentioned problems according to the present invention, a sample of multilayer film comprising the metal of high melting point deposited on the substrate or at least metal of high melting point and semiconductor is laid on the sample board in the vacuum container, and plasma is generated inside said vacuum container; then plasma treatment is provided by periodic on-off control of radio frequency bias voltage applied on said sample board.

Another feature of the present invention is that the percentage of on-period accounts for 5 to 60% in a cycle of on-off control of said radio frequency voltage.

Still another feature of the present invention is to provide plasma treatment of a sample comprising of at least the polycrystalline silicons having different conductivities deposited on the semiconductor substrate, by periodic on-off control of radio frequency power applied to said sample.

The present invention is further characterized in that a sample where a mask without containing carbon as a major component is formed on the component to be processed is placed on the sample board inside the vacuum container, and plasma is generated inside said vacuum container; at the time of at the same time, radio frequency bias voltage is applied to said sample board to provide periodic on-off control of radio frequency power applied to said sample board, thereby providing plasma treatment.

According to the present invention, radio frequency voltage applied to the sample is subjected to periodic on-off control, and voltage is set to a high amplitude in the processing of miniaturized patterns. Generally, increase in the energy of ion incident upon the wafer during etching process will cause etching to be predominant over deposition on the wide wall, and this avoid increase of line thickness. However, setting of ion to a higher value will increases the etching rate of the oxide film, and this is unfit for processing of a gate electrode where underlying oxide film is thin. To solve this problem, radio frequency voltage is provided with off-period, thereby reducing the number of high energy ions and hence avoiding reduction of selectivity.

This makes it possible to provide a semiconductor device surface processing method and system thereof which allows micro-processing of the dimension not exceeding 1 micron, or preferably not exceeding 0.5 micron.

According to the present invention, a smooth etched surface is obtained by periodic turning on and off of radio frequency power applied to said sample board in etching the multilayer film comprising metal and polycrystalline silicon. This enables processing of the device surface without etching through the underlying oxide film, and makes it possible to produce a high speed device having a small gate resistance of the multilayer film comprising metal and polycrystalline silicon.

The present invention provide a surface processing method which, in the plasma treatment of samples having different conductivities, for example, in etching treatment of the film containing both p- and n-type gates, minimizes the difference in processing shapes, without etching through the oxide film of the underlying gate, by periodic on-off control of radio frequency power applied to the sample and by increasing ion energy during the on-period.

Furthermore, the present invention makes it possible to increase selectivity between the etched substances including wiring and gate material for semiconductor devices such as TiN/Al/TiN, W/poly Si or the like, and such mask as oxide film or nitride film in surface processing of the semiconductor or the like.

BEST FORM OF EMBODIMENT OF THE PRESENT INVENTION

Figure 1:
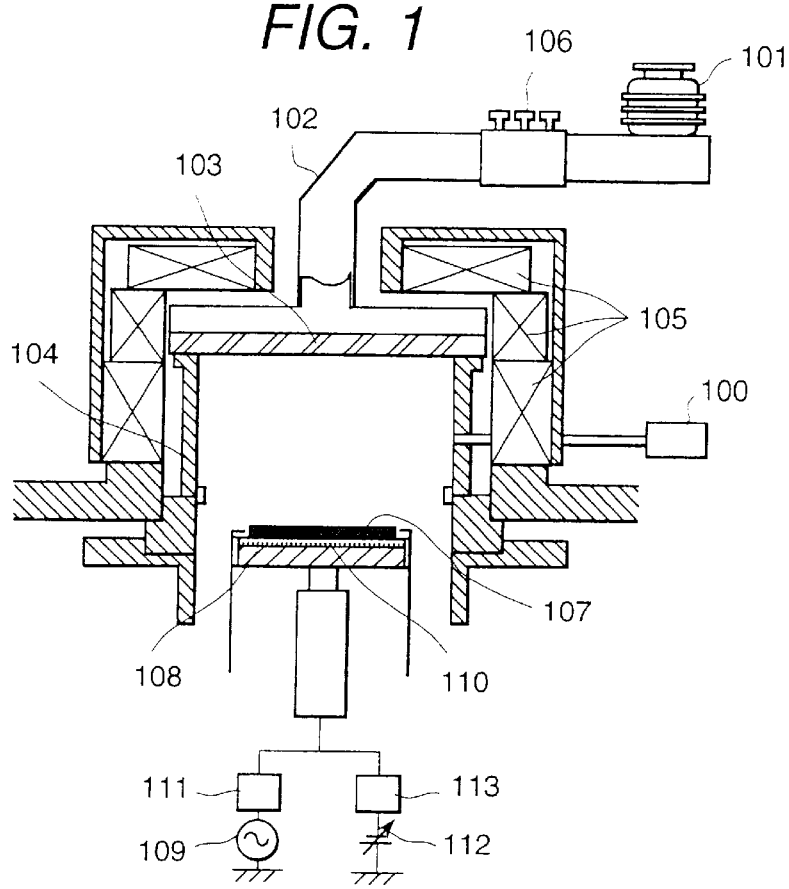
FIG. 1 is an overall profile representing the plasma etching system suited to embodiment of the present invention.
Figure 2:
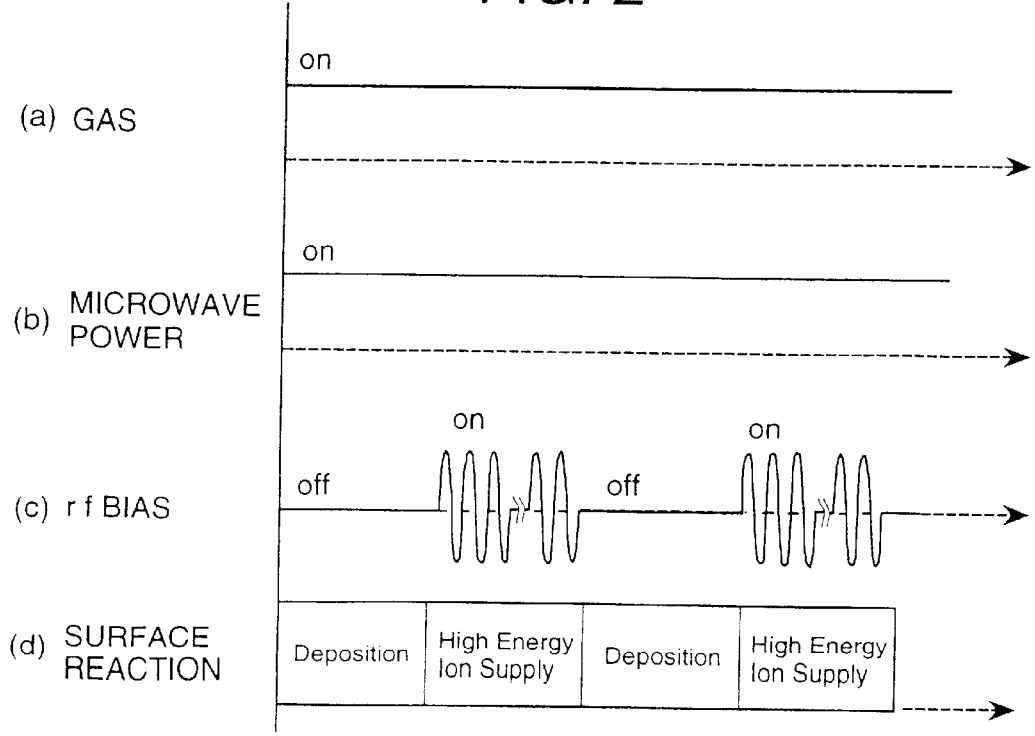
FIG. 2 is a drawing representing the gas supply in the vacuum container, and operations of the magnetron and radio frequency bias power supply during etching treatment by the system shown in FIG. 1.
Figure 3:
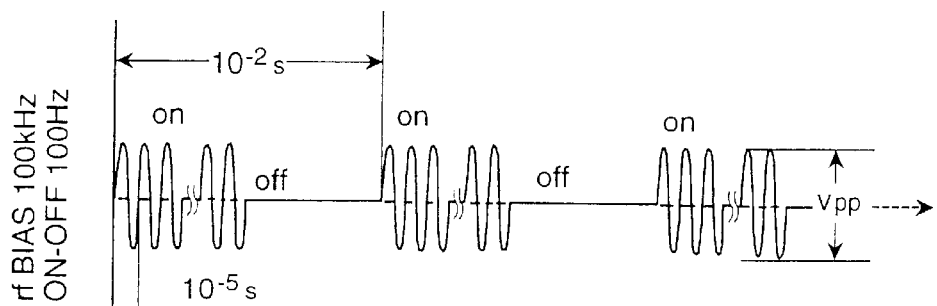
FIG. 3 is a drawing illustrating the radio frequency bias waveform according to the present invention.
Figure 3:
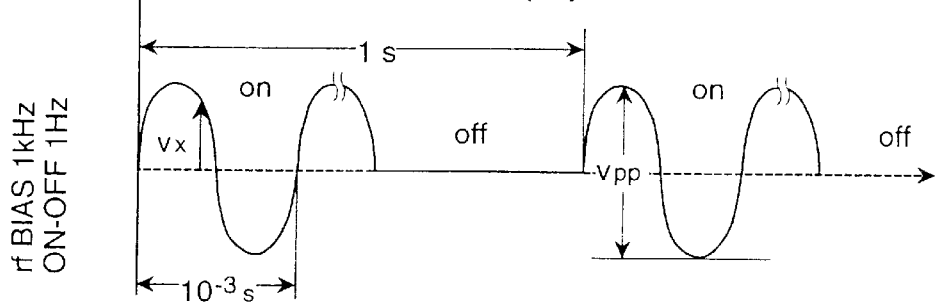

The following describes the embodiment of the present invention with reference to drawings: FIGS. 1 to 3 illustrate the embodiment of the present invention. FIG. 1 is an overall schematic configuration of the plasma etching system according to the present invention. Microwaves are led into the vacuum container 104 from magnetron 101 via the automatic matching device 106, waveguide 102 and feed window 103. Meanwhile, etching gas such as halogen is fed to the vacuum container 104 via the gas feed means 100. Feed of the microwaves allows plasma of this gas to be generated. The feed window 103 is made of such a material as quartz and ceramic which permits microwaves (electromagnetic waves) to pass through.

An electromagnet 105 is installed around the vacuum container 104. Magnetic field strength of the electromagnet 105 is set to cause resonance with microwave frequency. For example, if frequency is 2.45 GHz, magnetic field strength is 875 gauss. Since the cyclotron motion of electron in plasma resonate with electromagnetic wave frequency at this magnetic field strength, microwave energy is efficiently fed to plasma, thereby creating a high density plasma. It should be noted, however, that the microwave frequency is not restricted to 2.45 GHz. It can be from 100 Hz to 1 GHz. In this case, magnetic field strength changes with frequency.

A sample 107 is installed on the sample board 108. To accelerate ion incident on the sample, rf bias power supply 109 as a radio frequency power supply is connected to the sample board 108 via the bypass filter 111. An insulation film 110 such as ceramic or polymer film is provided on the surface of the sample board. The sample is electrostatically held on the sample board by connecting d.c. power supply 112 via a low pass filter 113 and applying voltage to the sample board 108.

FIG. 2 represents supply of gas into the vacuum container 104, and operations of the magnetron 101 and rf bias power supply 109 during etching treatment by the system given in FIG. 1. Concurrently as gas is supplied and etching is started, gas pressure is kept constant, as shown in (a). Microwaves power is continuously supplied as shown in (b).

Meanwhile, rf bias applied to the sample is subjected to periodic on-off control, as shown in (c). A high energy area and a low energy area are produced during the sample surface treatment by setting an ion acceleration on-off period through the on-off control of rf bias. In the low energy ion area, residual reaction product deposits in gas or plasma without etching in progress, as shown in (d).

The following describes the relationship among the rf bias frequency, its periodic on-off operation frequency and etching characteristics: FIG. 3 shows the rf bias waveform, where (a) corresponds to the etching conditions in the present embodiment. It indicates the waveform when the rf bias frequency is 100 kHz, and on-off operation frequency (modulated frequency) is 100 Hz. (b) shows the waveform when the rf bias frequency is 1 kHz and on-off operation frequency (modulated frequency) is 1 Hz, as in Japanese Patent Laid-Open No. 151360/1994 (corresponding Specifications of U.S. Pat. No. 5,352,324).

The following describes the specific embodiments of the present invention in comparison with the conventional examples.

First Embodiment

Figure 4:
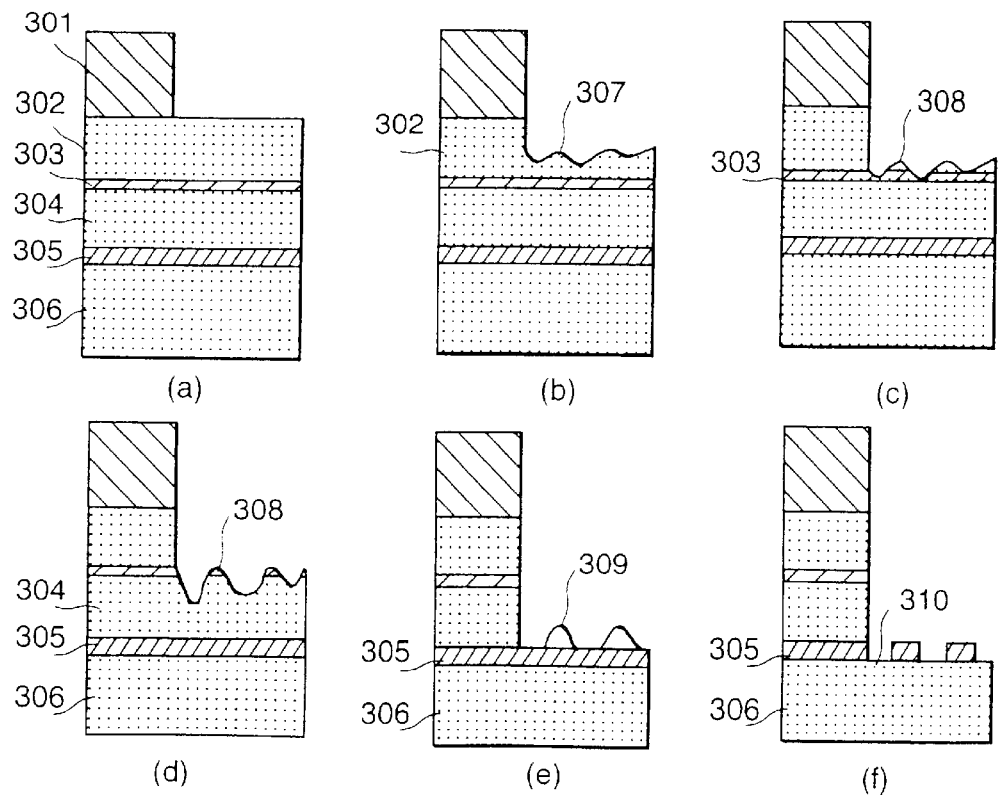
FIG. 4 is across sectional view showing each treatment process of semiconductor samples where polysilicon metal gate is etched by the conventional method.

The first description relates to an example of etching a polysilicon metal gate. FIG. 4 shows the temporal change of the cross section of the sample provided with etching treatment according to the conventional method, using the system given in FIG. 1.

Figure 5:
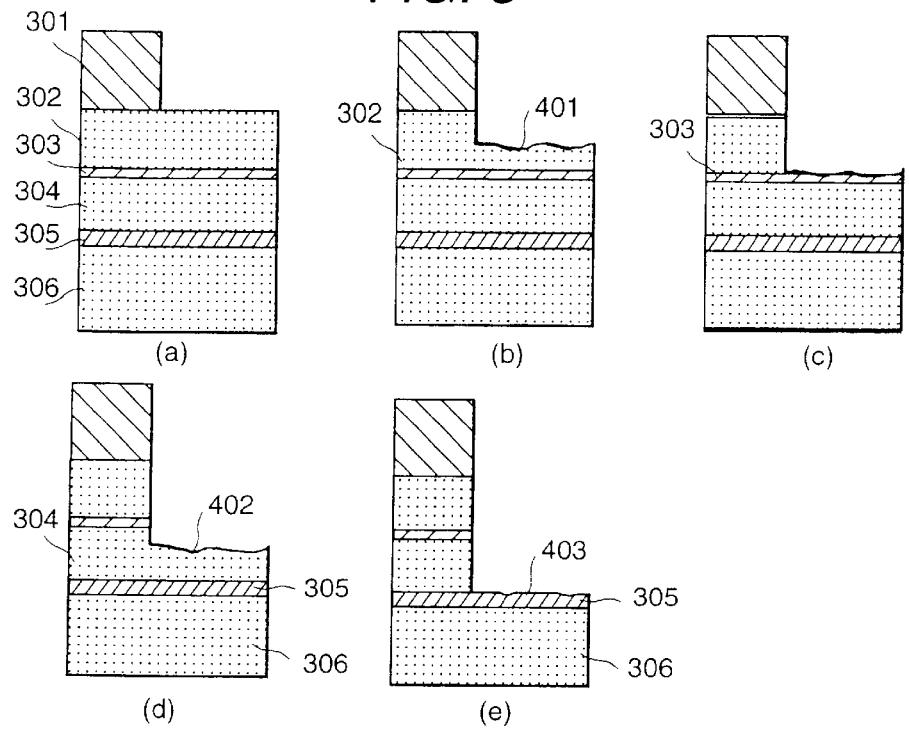
FIG. 5 is a cross sectional view showing each treatment process of semiconductor samples where polysilicon metal gate is etched by the method embodying the present invention.

FIG. 5 shows the temporal change of the cross sectional profile of the sample processed under the etching conditions according to the present embodiment.

As shown in FIGS. 4(a) and 5(a), the sample in the initial state consists of a multilayer film comprising an oxide film 305, polycrystalline silicon 304, tungsten nitride 303 and tungsten 302 deposited on the silicon substrate 306, with a mask 301 processed to a desired pattern on the top layer. Gas used for etching in this case consists of 30 cc of chlorine and 15 cc of oxygen at a pressure of 0.2 Pa with 500 watts of microwave power at a sample temperature of 70 degrees Celsius.

The conventional example given in FIG. 4 represents the cross section of the sample when etching is performed while continuous radio frequency voltage (power 140 W) is applied to the sample.

FIG. 5 represents the cross section of the sample when radio frequency power is applied under the conditions of the present invention, namely, when radio frequency power is subjected to periodic on-off control at 1 kHz. In this example, continuous 700 W power is applied is so that the percentage of the on-period in one on-off cycle (hereafter called "duty ratio") is 20%. Namely, the net power is 20% of 700 watts, which is 140 watts.

In the conventional method where radio frequency voltage is continuously applied, irregularities 307 occur on the etched surface as shown in FIG. 4(b), and this causes the etching residues 308 of tungsten or tungsten nitride to occur in some portions even after etching of tungsten 302 or tungsten nitride 303 (FIGS. 4c and b). Since the etching rate of the polycrystalline silicon 304 is higher than that of the tungsten or tungsten nitride, the etching residues 308 becomes a mask, further increasing the size of irregularities on the etched surface of the polycrystalline silicon 304. As a result, polycrystalline etching residues 309 of the polycrystalline silicon 304 partly occurs even when oxide film 305 has been reached, as shown in FIG. 4(e). Further etching for removal of etching residues will causes an oxide film missing area 310 penetrating the oxide film 305, as shown in FIG. 4(f). This will lead to a device failure, and needs improvement.

The present invention is intended to solve such a problem. FIG. 5 shows the etched cross section when the method according to the present invention is used; namely, when radio frequency power is applied by periodic on-off control. The architecture in FIG. 5(a) is that same as that of FIG. 3(a). If the method according to the present invention ensures that The etched surface 401 of tungsten and the etched surface 402 of the polycrystalline silicon 304 are smooth, as given in FIGS. 5(b) through (d). It also ensures that the etched surface 403 of the oxide film 305 is smooth without etching residues in the final stage, as shown in FIG. 5(e).

The following describes the causes for the results described above: Because vapor pressure of tungsten chloride is low in tungsten etching, etching rate will be reduced if chlorine gas alone is used. A compound with oxygen added to tungsten chloride (chemically expressed as "WxClyOz", where x, y and z are natural numbers) has a high vapor pressure, so use of chlorine/oxygen mixed gas increases the tungsten etching rate. In plasma etching, there is a local increase in the temperature on the surface of incoming ion, thereby promoting etching reaction. Therefore, to ensure uniform etching inside the surface, incoming ion is required to ensure uniform adsorption of chlorine and oxygen on the tungsten surface. Etching of tungsten nitride is almost the same as etching of tungsten both in mechanism and etching rate.

Figure 6:
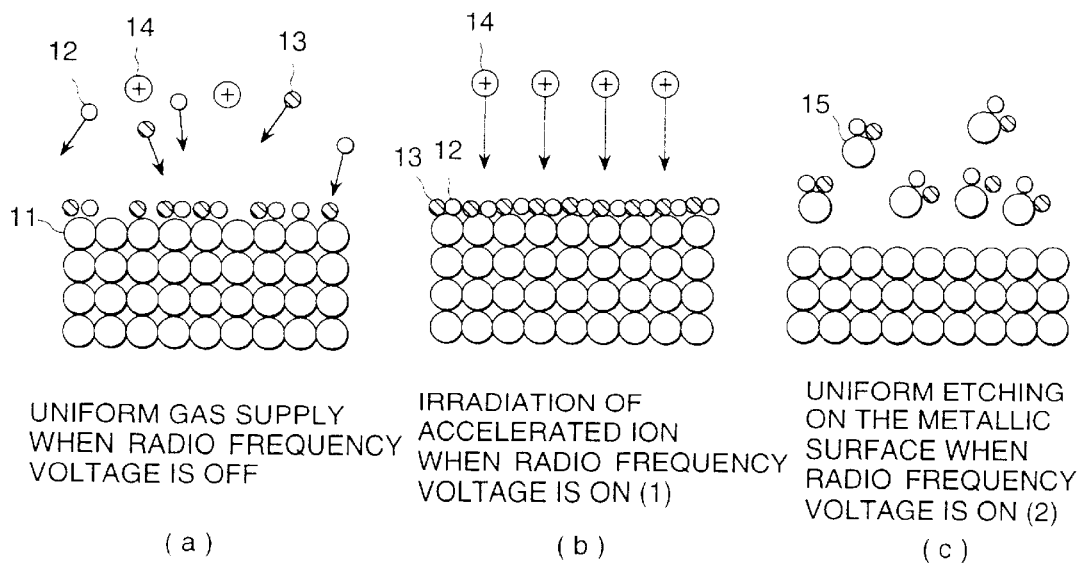
FIG. 6 is a drawing illustrating the action and effect of the on-off bias method according to the present invention.

To ensure uniform adsorption of multiple types of molecules, it is effective to provide a pause period in ion etching, as shown in FIG. 2. This enables a uniform adsorption of chlorine 12 and oxygen 13 onto the surface of the tungsten 11 during the pause period, namely, when radio frequency voltage applied to the sample is off, as shown in FIG. 6(a). After that, radio frequency voltage is turned on, and the ion 14 is accelerated and irradiated onto the surface (FIG. 6(b)). This is followed by uniform evaporation of reaction product 15 from the tungsten 11 surface, thereby ensuring uniform etching (See FIG. 6(c)).

Meanwhile, continuous application of radio frequency voltage causes continuous irradiation of ions accelerate by tungsten or tungsten nitride, and this causes the etching rate to be increased on the portion having adsorbed oxygen and chlorine, and to be decreased in the portion having adsorbed an insufficient amount of oxygen and chlorine. Thus, uneven etching rate occurs inside the surface, forming irregularities on the etched surface.

Underlying polycrystalline etching starts upon completion of tungsten etching. In the case of this gas, the etching rate of the polycrystalline silicon is higher than that of the tungsten, so there will be an increasing difference in irregularities between the portions with and without etching residues of tungsten, and etching residues occurs.

In addition to the above reasons, on-off control of radio frequency voltage causes the accelerated ion irradiation frequency to be reduced, and the etching rate to be reduced. To get the etching rate as that in the continuous bias, the ion energy must be increased. Increase of ion energy also contributes to obtaining a smooth surface. Some effect can be obtained even if there is no gas such as oxygen which promotes tungsten etching.

For the architecture of the etched sample, the similar effect is gained from a single layer film having a high melting point such as tungsten 302, without polycrystalline silicon 304 or tungsten nitride 303 in FIG. 5.

The following describes the preferred etching conditions according to the present invention:

The appropriate volume of oxygen mixed with chlorine is 5% to 70%. The higher the sample temperature, the higher the etching rate of tungsten; it is preferred to be not less than 50 degrees Celsius. The duty ratio of the on-off control of the voltage applied to the sample is preferred to be 5% through 60%. Below this range, power will be difficult to obtain, and hence the etching rate will be reduced. Beyond this range, the effect in comparison with the continuous bias will be reduced. The frequency of periodic on-off operation is preferred to be in the range of 100 Hz to 10 kHz.

For example, as disclosed in the Japanese Patent Laidopen No. 174320/1988, irregularities corresponding to that frequency occur on the side wall of the etched groove at a repetition frequency not exceeding several Hz according to the conventional method. If the frequency is too high, configuration of the electric circuit will be difficult. For the radio frequency voltage applied to the sample, it is effective to set the amplitude of the voltage as a rough indication of ion energy at 500 volts or more.

Further, gases containing fluorine atom such as $SF_6$ and $CF_4$ are also available as tungsten etching gas. Smooth etching of tungsten is also ensured by on-off control of the radio frequency voltage for these gases.

Addition of oxygen to these gases allows tungsten etching to be accelerated by oxygen. This brings about greater effects. Use of the gas containing fluorine atom increases etching rate despite a low sample temperature comparatively, but etching is promoted by fluorine on the side wall of the etching groove of the polycrystalline silicon part. So sample temperature must be kept below 20 degrees Celsius.

Up to now we have taken an example of tungsten to describe the metal to be processed. Metal of high melting point capable of withstanding high-temperature heat treatment such as molybdenum, nickel, cobalt and titanium can be cited as other examples. Furthermore, a combination of these metals with nitride can be used as a barrer film to prevent dispersion. In the processing of these materials, a smooth etched surface can also be provided by setting ion energy at a high value through on-off control of radio frequency voltage according to the present invention or by addition of gas accelerating metal etching such as oxygen.

A normal organic photoresist may be employed as a mask to process these materials to a desired pattern. However, carbon contained in the resist accelerates oxide film etching, and reduces selectivity. So the film of such an inorganic substance as silicon oxide or silicon nitride provides a higher selectivity of polycrystalline silicon for the underlying oxide film.

In the sample consisting of a lamination between the high melting point metal film and semiconductor film such as the one according to the present embodiment, it is effective to change sample temperature at the time of plasma treatment in conformity to film type. For example, treat the film of the metal with a high melting point at a high temperature and, and treat the semiconductor film at a low temperature. This will optimize reaction between the etched film and etchant, thereby improving treatment rate. Furthermore, higher-precision surface processing at a higher treatment rate is provided by combination with the on-off control of radio frequency power.

Second Embodiment

The following describes an embodiment where etching process is divided into several steps in order to increase the effects of said Embodiment:

This embodiment is to get the optimum etching profile by changing the etching conditions at the time point when film type is switched, based on the intensity of light emitted from the plasma during etching or etching time.

Let us take an example of the sample having an architecture shown in FIG. 5. Upon completion of etching of the tungsten 302 and tungsten nitride 303, the condition is selected to allow polycrystalline silicon 304 to be etched to the oxide film 305 at a high selectivity. Namely, since etching of polycrystalline silicon 304 does not require as much ion energy as that in tungsten etching, the radio frequency voltage applied to the sample is reduced. Furthermore, oxygen to accelerates tungsten etching, but it controls etching of polycrystalline silicon, so measures are taken, for example, to select the step where the amount of oxygen to be added is small. To determine the time of switching the step, monitor the intensity of the light emitted from tungsten atom, or measure the time when etching of the tungsten and tungsten nitride completes in advance. The step can be switched based on this time.

To switch the step, the condition can be changed in such a way that selectivity is increased with respect to the oxide film 305 when etching of the polycrystalline silicon 304 has completed. This can be achieved by reducing the radio frequency power applied to the sample, increasing the amount of oxygen to be added or adding HBr gas. For step switching, monitor the changes in the intensity of light emitted from silicon.

Furthermore, simultaneous use of the above two switching operations enables etching of higher precision. In this case, the end point of etching for each substance is monitored by simultaneous monitoring of light of two different waveforms emitted from the tungsten and silicon, and the step is changed in three stages.

Furthermore, irregularities on the etched surface can be reduced by sufficiently reducing the etching rate of the polycrystalline silicon than those of tungsten and tungsten nitride. In other words, despite partial termination of etching of the tungsten nitride, irregularities on the metal surface can be reduced if etching is stopped on the polycrystalline silicon film. Oxygen also serves to reduce the etching rate of the polycrystalline silicon, so this effect can be gained by increasing the percentage of oxygen. In this case, oxygen is adsorbed uniformly to the polycrystalline silicon surface during the off-period by on-off control of the radio frequency cycle. This makes it possible to get a smooth etched surface.

According to this method, the etching rate of the polycrystalline silicon is very small. Therefore, high precision etching can be achieved by selecting the condition which permits etching of polycrystalline silicon at a high selectivity with respect to the oxide film, upon termination of the etching on the metal and barrier layers.

As discussed above, in the etching of multilayer film comprising the metal and polycrystalline silicon, the present invention has the effect of providing a smooth etched surface by a periodic on-off control of radio frequency voltage applied to the sample, thereby making it possible to process a device without missing the underlying oxide film. This permits creation of a high speed device having a small gate resistance of the multilayer film comprising a metal and polycrystalline silicon.

Third Embodiment

The following describes an example of applying the present invention to the etching of the dual gate in comparison with the conventional method:

FIGS. 7(a) and 8(a) are initial cross sectional views representing a sample processed by a system given in FIG. 1. Oxide film 305, n-type polycrystalline silicon 313 and p-type polycrystalline silicon 314 are formed on the silicon substrate 306 of the sample, with a mask 301 processed to a desired pattern on the top layer. Gas used for etching consists of 55 cc of chlorine and 4 cc of oxygen at a pressure of 0.4 Pa with 400 watts of microwave power.

Figure 7:
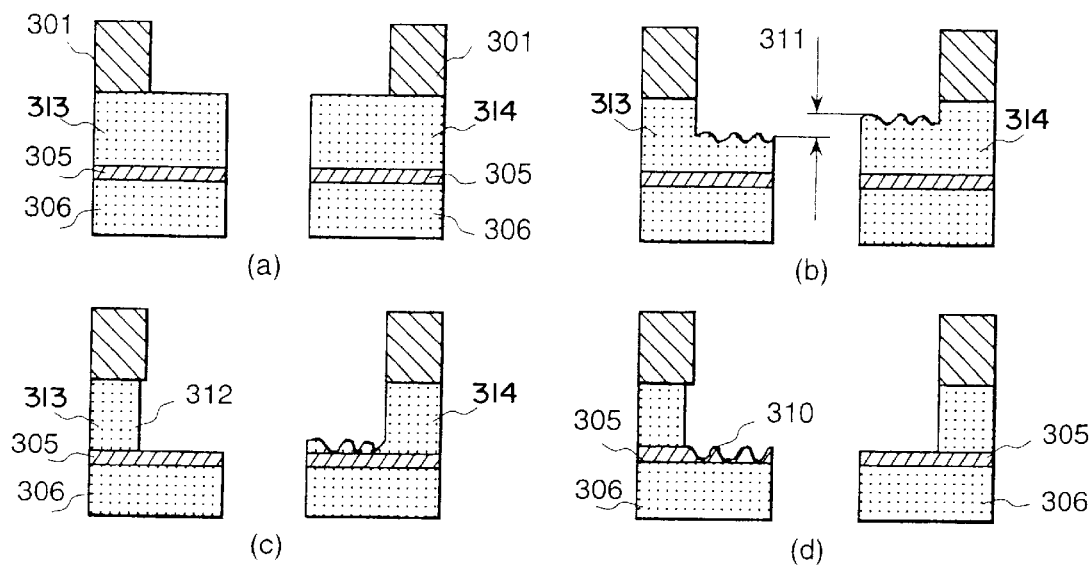
FIG. 7 is a cross sectional view representing each treatment process of the semiconductor sample where the dual gate is provided with etching treatment by the conventional method.

FIG. 7 shows the temporal change of the etching profile of the sample during continuous application of radio frequency voltage (power 35 W) according to the conventional method. A difference in etching depth 311 occurs between the p- and n-type silicons due to the difference of etching rate. This causes processing of n-type polycrystalline silicon 313 to be completed first, as shown in FIG. 7(c). Since etching residues remain in the p-type silicon, a continued etching operation will cause oxide film missing area 310 to occur on the n-side when processing of p-type polycrystalline silicon 303 has completed, as shown in FIG. 3(d). A side etch 312 will also occur on the n-type polycrystalline silicon. Under this condition, a device failure will result, so some improvement must be made.

FIG. 7 shows the temporal change of the etching profile of the sample during continuous application of radio frequency voltage (power 35 W) according to the conventional method. A difference in etching depth 306 occurs between the p- and n-type silicons due to the difference of etching rate. This causes processing of n-type polycrystalline silicon 302 to be completed first, as shown in FIG. 7(c). Since etching residues remains in the p-type silicon, a continued etching operation will cause oxide film missing area 310 to occur on the n-side when processing of p-type polycrystalline silicon 303 has completed, as shown in FIG. 3(d). A side etch 312 will also occur on the n-type polycrystalline silicon. Under this conditions, a device failure will result, so some improvement must be made.

Figure 8:
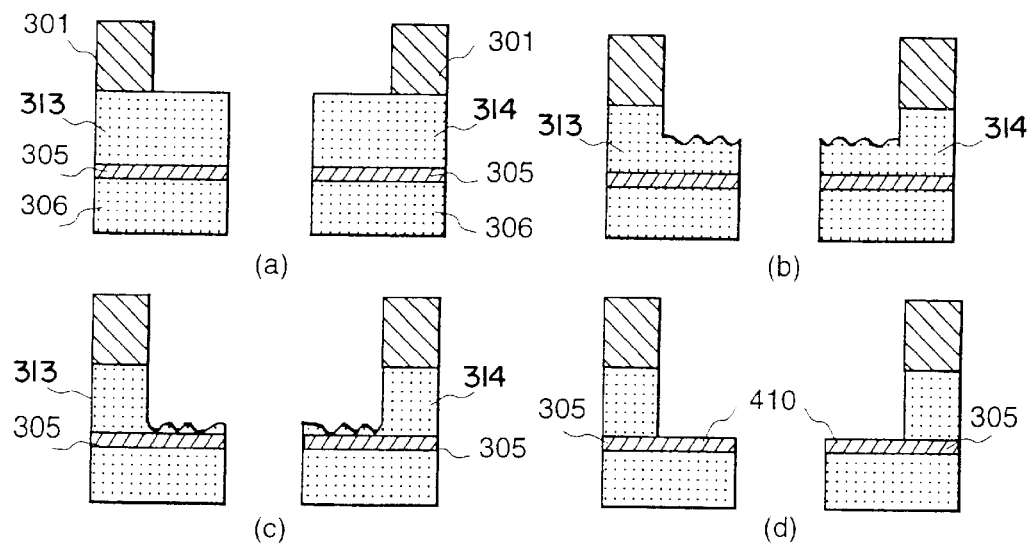
FIG. 8 is a cross sectional view representing each treatment process of the semiconductor sample where the dual gate is provided with etching treatment by the method as an embodiment according to the present invention.

Meanwhile, FIG. 8 represents temporal changes in the etching shape when radio frequency power according to the present invention is applied at a frequency of 1 kHz through periodic on-off control. Continuous power of 175 watt with a duty ratio of 20% is applied.

Namely, the net power is 20% of 175 watts which is 35 watts. As shown in FIGS. 8(b) and (c), etching of n- and p-type polycrystalline silicons 313 and 314 is carried out at the same rate. If the oxide film starts to be exposed as shown in FIG. 8(c), etching gas is changed into the gas consisting of 100 cc of hydrogen bromide and 9 cc of oxygen, and application of radio frequency voltage is changed to continuous application. Because of a high selectivity of polycrystalline silicons 313 and 314, and oxide film 305, hydrogen bromide provides a flat oxide film etched surface 410 without etching residues 308 in the final phase, as shown in FIG. 8(d).

Namely, the net power is 20% of 175 watts which is 35 watts. As shown in FIGS. 8(b) and (c), etching of n- and p-type polycrystalline silicons 302 and 303 is carried out at the same rate. If the oxide film starts to be exposed as shown in FIG. 8(c), etching gas is changed into the gas consisting of 100 cc of hydrogen bromide and 9 cc of oxygen, and application of radio frequency voltage is changed to continuous application. Because of a high selectivity of polycrystalline silicons 302 and 303, and oxide film 305, hydrogen bromide provides a flat oxide film etched surface 410 without etching residues 308 in the final phase, as shown in FIG. 8(d).

The following describes the causes for the above results: In plasma etching, etching reaction is accelerated by local increase of the temperature on the surface where ion as positive charge has entered. Since the n-type polycrystalline silicon contains more electrons than the p-type, differences in ion energy occurs close to the n-type and p-type polycrystalline silicon surface even when ion is incident upon the polycrystalline silicon with the same ion energy. If ion is launched with a high energy, effect of the electron contained in the polycrystalline silicon and difference in etching reaction can be reduced. But this will make it difficult to stop etching on the underlying oxide film. To use a high ion energy, it is effective to assign a pause period to ion etching, as shown in FIG. 2. As discussed in FIG. 6, chlorine 12 and oxygen 13 are uniformly adsorbed onto the surfaces 11 of both p-and n-type polycrystalline silicons during the pause period, which is an off-period of the radio frequency voltage applied to the sample. After that, radio frequency voltage is turned on and ion 14 of higher energy is accelerated to be incident on the surface. Then reaction product 15 evaporates uniformly from the surface 11 of the polycrystalline silicon, with the result that uniform etching is carried out.

The following describes the etching conditions according to the present embodiment: The appropriate volume of oxygen mixed with chlorine is 5% to 70%. The duty ratio of the on-off control of the voltage applied to the sample is preferred to be 5% through 60%. Below this range, power will be difficult to obtain, and hence the etching rate will be reduced. Beyond this range, the effect in comparison with the continuous bias will be reduced. The frequency of periodic on-off operation is preferred to be in the range of 100 Hz to 10 kHz.

A normal organic photoresist may be employed as a mask to process these materials to a desired pattern. However, carbon contained in the resist accelerates oxide film etching, and reduces selectivity. So the film of such an inorganic substance as silicon oxide or silicon nitride provides a higher selectivity of polycrystalline silicon for the underlying oxide film.

Fourth Embodiment

Figure 9:
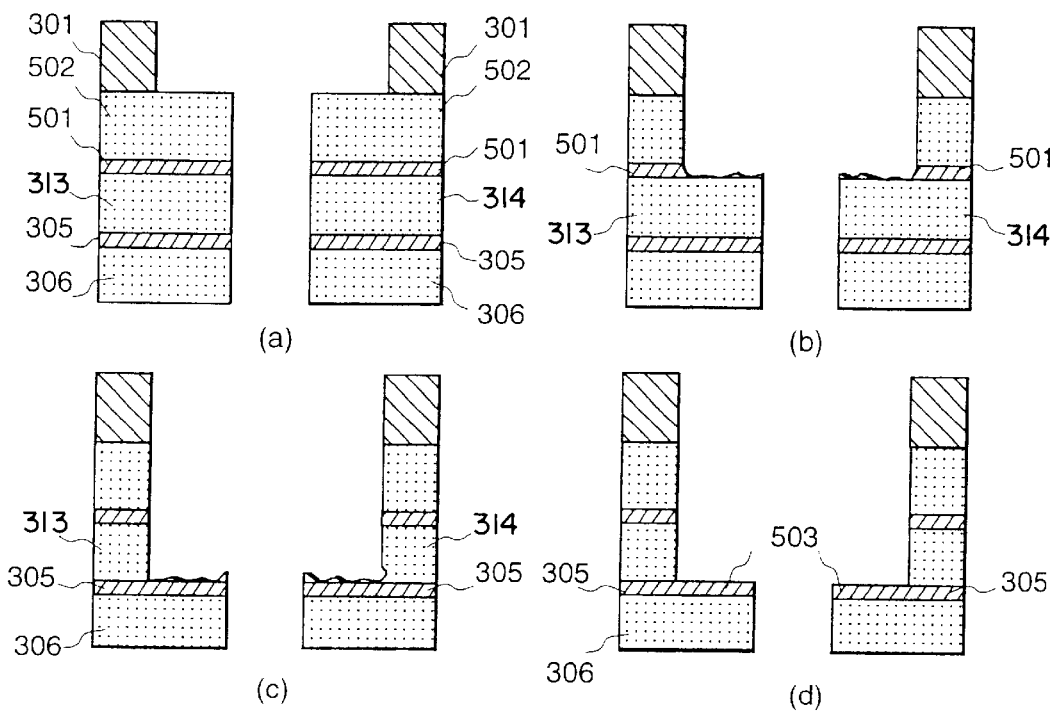
FIG. 9 is a cross sectional view representing temporal changes of the etched shape of another sample treated according to the present invention.

FIG. 9 is a cross sectional representing the temporal change of etching profiles of another sample processed according to the present embodiment.

As shown in FIG. 9(a), the sample in the initial state consists of a multilayer film comprising an oxide film 305, n-type polycrystalline silicon 313, p-type polycrystalline silicon 314, tungsten nitride 501 and tungsten 502 deposited on the silicon substrate 306, with a mask 301 processed to a desired pattern on the top layer. To reduce the gate electrode resistance, this architecture uses tungsten as a metal. Tungsten nitride serves as a barrier layer to reduce mutual dispersion between the tungsten and polycrystalline silicon.

Tungsten and tungsten nitride films are etched by a bias power of 720 W with a duty ratio of 20%, 38 cc of chlorine and 12 cc of oxygen at a pressure of 0.2 Pa with 500 watts of microwave power. If polycrystalline silicon film 302 and 303 starts to be exposed as shown in FIG. 9(b), application of radio frequency voltage is changed to on-off application at a frequency of 1 kHz with a 40% duty ratio. When the oxide film 305 starts to be exposed as shown in FIG. 9(c), etching gas is changed from chlorine to the gas consisting of 100 cc of hydrogen bromide and 9 cc of oxygen, and application of radio frequency voltage is changed to continuous application. Because of a high selectivity of polycrystalline silicons for oxide film 305, hydrogen bromide provides a flat oxide film etched surface 503 without etching residues in the final phase, as shown in FIG. 9(d).

For polycrystalline silicons, a combination of p-type semiconductor and n-type semiconductor or a combination of i-type semiconductor and p-type semiconductor can also be processed in addition to p- and n-type polycrystalline silicons. Molybdenum, nickel, cobalt and titanium can be used to form the metal layer, and a combination of these metals with nitride film can be used to form the barrier layer, and they can be processed in the similar manner.

As discussed above, simultaneous etching of p- and n-type gates without difference in processing is enabled in the etching of the film containing both p- and n-type silicons by increasing ion energy in the on-period through periodic on-off control of radio frequency voltage applied to the sample. This makes it possible to produce a CMOS device having a dual gate architecture.

Fifth Embodiment

Figure 10:
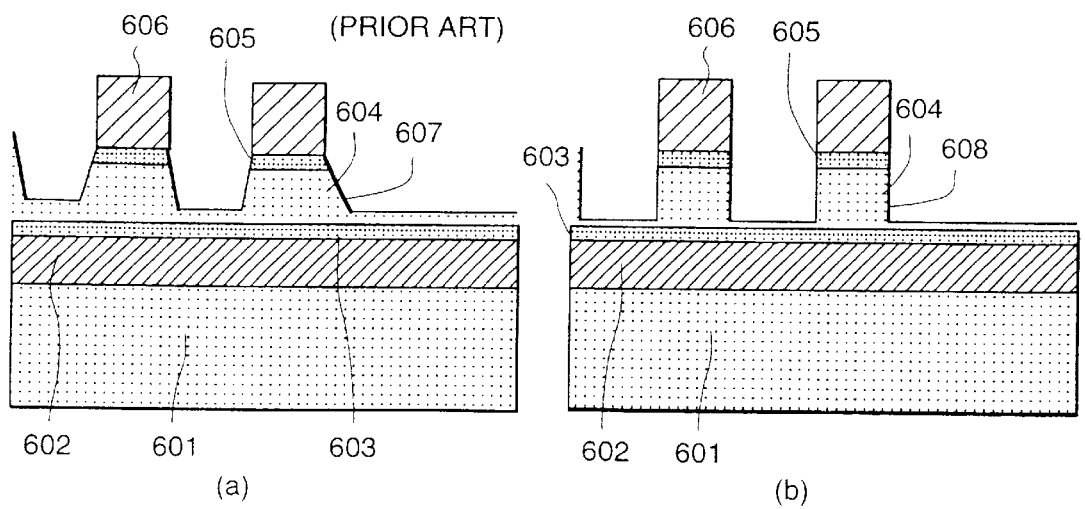
FIG. 10 is a sample structural view representing the result of applying the present invention to metal etching.

The following describes the result of applying the present invention to the etching of metal such as aluminum. As shown in FIG. 10, the sample consists of 300 nm of oxide film (602), 100 nm of TiN (603), 400 nm of Al (604) and 75 nm TiN (605) deposited on the substrate Si 601, with 1 micron of resist mask (606) on the top layer. The line and base have a dimension of 0.4 micron. Etching gas comprises a mixture of chlorine (80 sccm)) and BC13 (20 sccm)) at a pressure of 1 Pa. The microwave power supply 101 produces power of 700 watts, and the electrode temperature is set to 40 degrees Celsius. The frequency of radio frequency voltage power supply 109 is 800 kHz, and on-off repetition frequency is 2 kHz.

FIG. 10(a) represents the etching profile according to the conventional continuous bias method where power is 70 W, and FIG. 10(b) shows the etching profile according to the on-off bias method based on the present invention where peak power is 350 watts with a duty ratio of 20%. This sample has a big profile microloading, and exhibits a very poor verticality of side wall 607 facing the wide space during continuously bias, which can be reduced by on-off bias.

Sixth Embodiment

Figure 11:
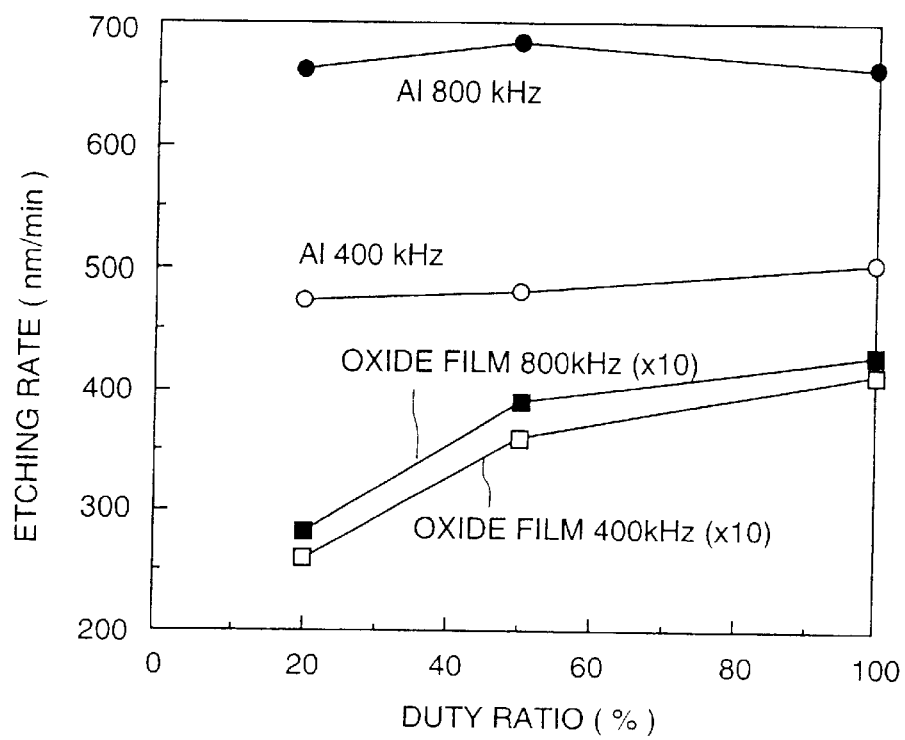
FIG. 11 is a drawing showing the relationship of etching rate between aluminum and oxide film with respect to duty ratio when aluminum for wiring of the semiconductor device is subjected to etching according to the present invention.
Figure 12:
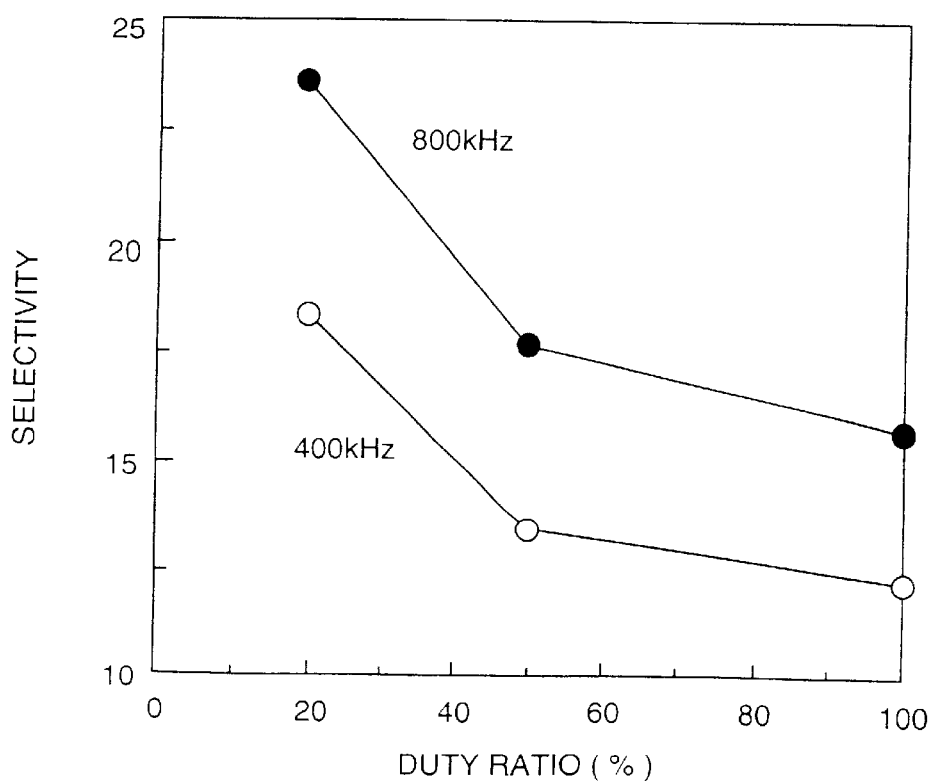
FIG. 12 is a drawing showing the relationship of selectivity between aluminum and oxide film with when aluminum for wiring of the semiconductor device is subjected to etching according to the present invention.

The following describes the result of etching aluminum used for wiring of a semiconductor device according to the method based on the present invention using the hard mask, with reference to FIGS. 11 and 12. Etching gas used is $Cl_2$(80 sccm)+$BC_{13}$(20 sccm) at a pressure of 1 Pa, and the microwave power supply 11 produces power of 700 W. The bias power supply 10 produces power of 60 W, with two frequencies of 400 kHz and 800 kHz used in the test, and periodic on-off operation frequency is set to 2 kHz. FIG. 11 shows the relationship of etching rate between aluminum and oxide film with respect to the duty ratio. FIG. 12 shows the relationship of selectivity between aluminum and oxide film.

The duty ratio of 100% is a continuous bias according to the conventional example. When the duty ratio is reduced, peak power is adjusted so that the product between peak power and duty ratio is 60 watts. When on-off control is performed and the duty ratio is reduced at bias frequencies of 400 kHz and 800 kHz, the etching rate of the oxide film is reduced, as shown in FIG. 11, and the selectivity of aluminum for oxide is increased as shown in FIG. 12. In other words, when oxide film is used as a mask and on-off control is performed, selectivity of the mask and aluminum can be increased. This effect becomes conspicuous from the duty ratio of 50% or less.

Figure 13:
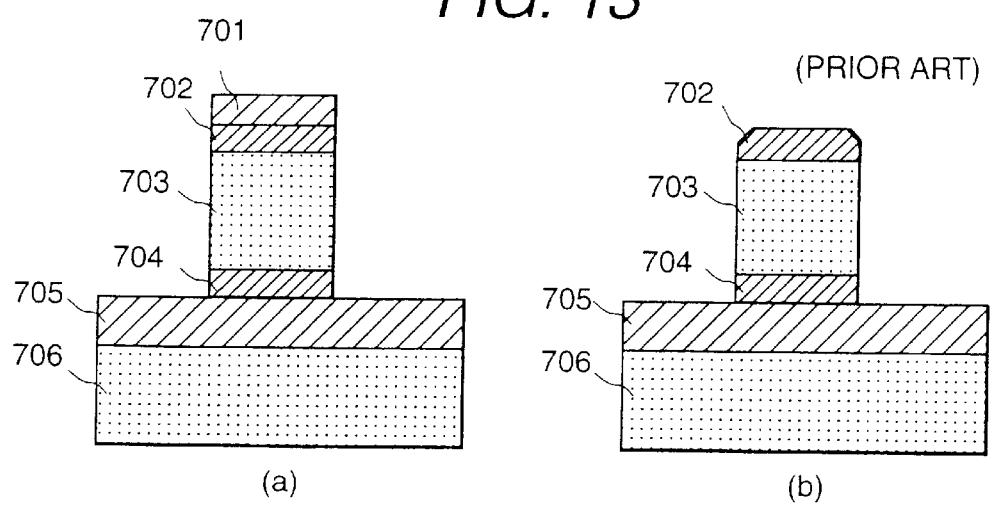
FIG. 13 is a cross sectional view when the sample made of a hard mask is subjected to etching treatment.

In still another embodiment of the present invention where on-off control is adopted and 200 sccm of $CH_4$(4%)+Ar is added to $Cl_2$(80sccm)+$BCl_3$(20sccm) at a pressure of 2 Pa is used as gas, the selectivity of oxide film with respect to aluminum is further increased from 20% to 50%. Gas containing carbon such as $CH_4$ is adhesive, and deposition is likely to occur on the oxide film during the bias-off period. This is considered to make a further contribution in improving the efficiency. FIG. 13 is a cross sectional view showing a hard mask sample subjected to etching when adhesive gas is added.

The sample architecture given in FIG. 13 shows a multilayer film sample comprising a TiN film 702 (80 nm), aluminum film 703 (500 nm), TiN film 704 (100 nm), oxide film 705 and Si substrate 706 in that order under the hard mask 701 (100 nm) of the oxide film. Etching is performed under the condition that 200 sccm of $CH_4(4\%)$+Ar added to $Cl_2$(80 sccm)+$BCl_3$(20 sccm) at a pressure of 2 Pa is used as gas, with a microwave power of 800 W.

Bias power is 250 watts with a duty ratio of 20% according to the method based on the present invention as shown in FIG. 13($a$), and is 50 watts according to the conventional continuous bias method as shown in FIG. 13($b$). Judging from the wave form of light emitted from plasma, 30% excessive etching is performed after completion of etching of the TiN film 704 on the bottom layer. When etching is performed according to on-off bias method as shown in FIG. 13($a$), there is a 10 nm residue of hard mask 701. Meanwhile, when etching is made according to the continuous bias method, the hard mask is completely etched, and TiN film 702 is partially etched as shown in FIG. 13($b$). As discussed above, on-off control of bias increases the selectivity of the metal and hard mask in metal etching using hard mask.

Seventh Embodiment

Figure 14:
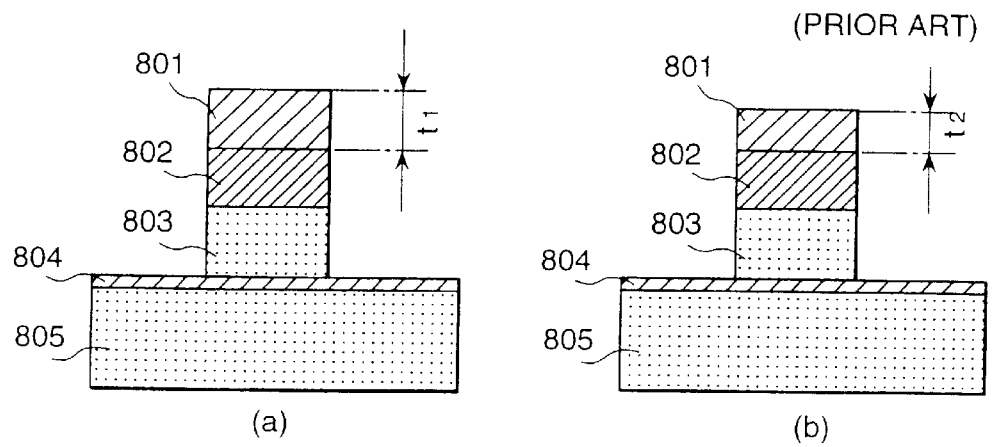
FIG. 14 is a cross sectional view of the processed gate of a semiconductor device.

The following uses FIG. 14 to illustrate an example of applying the present invention to the processing of the gate of a semiconductor device using the hard mask: Film thickness is smaller in gate processing than in metal processing, and the problem of selectivity with resist is not so serious as that of metal. However, if processing dimensions is smaller and the multilayer film of less resistant W and Poly-Si is used instead of the multilayer film of the conventional tungsten silicide (WSi) and Poly-Si, selectivity between the mask and substrate poses a problem because of smaller etching rate of W, even if the hard mask is used.

FIG. 14 shows the result of etching the tungsten film 802 (100 nm)/poly-Si film 803 (100 nm)/$SiO_2$ film 804 (4 nm)/Si substrate 805 where nitride film ($Si_3N_4$) is used as a hard mask 801 (200 nm). The etching gas used consists of chlorine(38 sccm)+oxygen(12 sccm) at a pressure of 0.2 Pa with a microwaves power of 500 W. In this type of gas, oxygen serves as a adhesive gas. Bias power is shown in FIG. 14($a$) as on-off bias with a peak power of 500 watts and a duty ratio of 30%, and is given in FIG. 14 as continuous bias with a peak power of 150 W.

The remaining thickness t of the mask after completion of etching as judged from light emission is t1=120 nm in the case of on-off bias shown in FIG. 14($a$), whereas t2=80 nm in the case of continuous bias shown in FIG. 14($b$). This shows that the present invention ensures a higher selectivity between the mask and underlying multilayer film.

In this architecture, the metal of high melting point such as molybdenum and chromium is used instead of tungsten. A barrier layer comprising a metal nitride can be provided between the metal and poly-Si.

Eighth Embodiment

The following describes the embodiment of gas and others: Carbon hydride gas such as methane, ethane and propane is effectively used as adhesive gas in metal etching. The effect is the same when used without diluting with Ar, but dilution with Ar reduces explosive characteristics, thereby ensuring greater safety. Dilution rate of $CH_4$ with Ar is not restricted to 4%. This gas has the advantage that it is easy to obtain. Furthermore, adhesive gas includes $CF_4$, $CH_2F_2$, $CHF_3$ and $C_4F_8$. The same effect can be obtained from the use of gas containing nitrogen such as nitrogen gas or $NH_3$. Adhesive gas used for gate etching includes gas containing oxygen such as CO and $CO_2$, in addition to oxygen.

The same effect can be obtained when $F_2$, HBr, HI or mixture of these halogen gases containing chlorine is used as halogen gas, in addition to chlorine. The mixing rate of the adhesive gas is preferred to be 0.5% to 50% according to experiment. There is no effect below this range, and the etching rate of the metal is much reduced over this range.

The multilayer film consisting of oxide film and nitride film or multilayer film consisting of resist and hard mask may be used as a mask of the device.

An inorganic substance such as alumina which does not contain carbon as the main component is used as hard mask.

In the surface processing method using plasma as in the present embodiment as described above, oxide film and nitride film is used as a mask of the substance to be etched, and repeated on-off control of the bias power supply to accelerate ion in plasma is performed; therefore, selectivity is improved further even when a thin mask is used.

Furthermore, when etching gas is mixed with adhesive gas, halogen gas serves to progress etching, while adhesive gas has a function to check the progress of etching. If an off-period is assigned to bias power supply, the action of adhesive gas alone becomes conspicuous when bias power supply is off, namely when accelerated ion is not incident on the sample surface. This reduces the etching rate of such substances with a low etching rate as oxide film or oxide film, thereby increasing selectivity.

Ninth Embodiment

Figure 15:
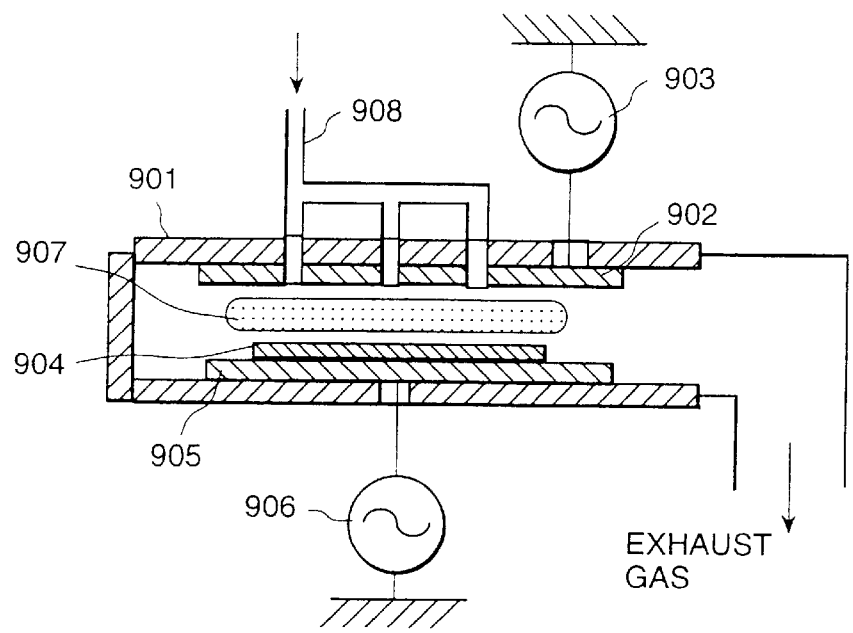
FIG. 15 is a cross sectional view of an example of the architecture of another system according to the present invention.

FIG. 15 shows the architecture of a further system where the present invention is applied. This system allows plasma to be generated by capacitive coupling of radio frequency power. Two electrodes 902 and 905 are placed in parallel in the vacuum container 901.

A radio frequency power supply 903 and radio frequency power supply 906 are connected to each electrode. A sample 904 is placed on the electrode 905 serving as a sample board. Gas is put into the container through a feed pipe 908 from a hole opened toward the electrode 902 facing the sample. Plasma 907 is produced between two electrodes.

In this system, selectivity of the mask and substance to be processed can be improved by processing the sample according to the method of the present invention. Similar effects can be obtained in various sample treatment methods introduced in the previous embodiments.

Tenth Embodiment

Figure 16:
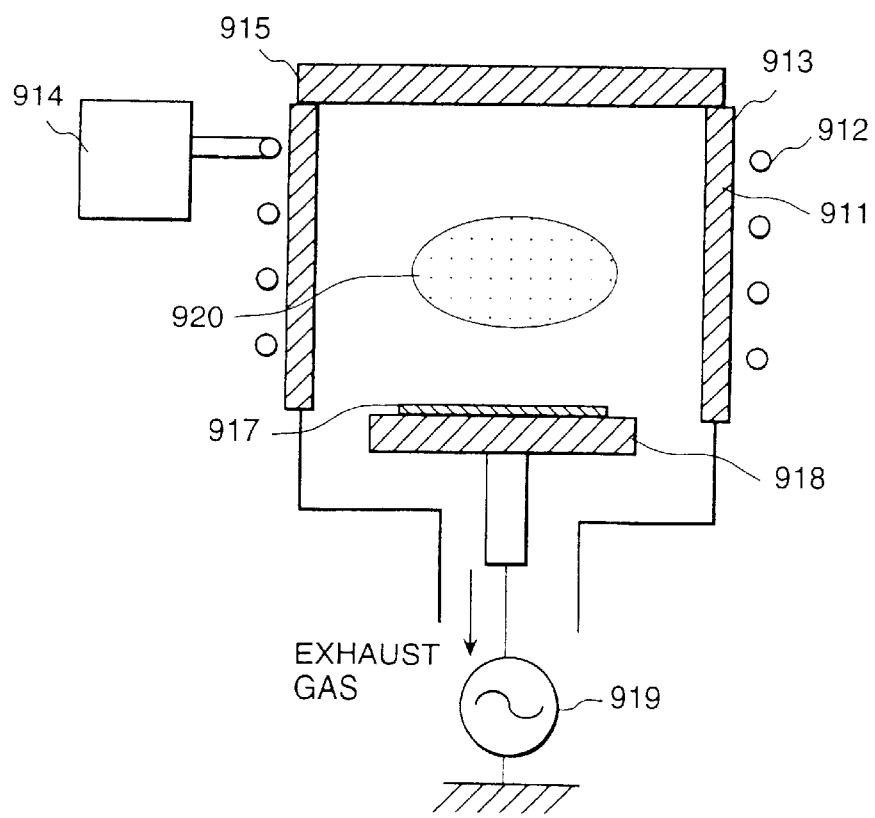
FIG. 16 is a cross sectional view of an example of the architecture of still another system according to the present invention.

FIG. 16 shows the architecture of still another system where the present invention is applied. In this system, plasma is generated by inductive coupling at the frequency of so-called radio wave band ranging from hundreds of kHz to scores of MHz (hereafter called "rf"). The vacuum container 913 is made of such a substance as alumina and quartz which allows electromagnetic wave to pass by. An electromagnetic coil 912 to generate plasma 920 is wound on the substance. The coil is connected with a rf power supply 914. A sample board 918 is located in the vacuum container 911. A sample 917 is placed on it and is connected to the radio frequency power supply 919. The vacuum container 911 is provided with a top cover 915. It can be an integral unit. In this system, selectivity between the mask and substance to be processed can be improved according to the method of the present invention.

As described above, the present invention enables etching of the wiring or gate material of the semiconductor device such as TiN/Al/TiN or W/poly-Si at a high selectivity with respect to the hard mask such as oxide film or nitride film. Furthermore, similar effects can be obtained in various sample treatment methods introduced in the previous embodiments.

In bias on-off control according to the present embodiment, power output is zero during the off-period of bias power supply 109, as shown in FIG. 2(c). However, it need not necessarily be zero. In other words, the off-period is the period when accelerated ion does not enter the sample surface. Bias voltage need not be applied if the power output is sufficiently smaller than the on-period when ion enters the sample surface to prevent etching from taking place. Thus, the off control in the on-off control includes a small power output.

In etching metal or multilayer film comprising metal and polycrystalline silicon as described above, the present invention provides a surface processing method which ensures a smooth etching surface by periodic on-off control of the radio frequency voltage applied to the sample, etching on the flat surface without irregularities on the etching surface, and etching of the multilayer film without passing through the underlying gate oxide film.

Furthermore, in simultaneous etching in the presence of gate electrodes with different electrical conductivity, the present invention provides a surface processing method which minimizes the difference in processing shapes, without passing through the underlying gate oxide film. Moreover, in the surface processing for semiconductor and others, the present invention provides a surface processing method which improves selectivity of the etched substance and mask.

To meet the requirements for ever smaller semiconductor devices, the present invention provides a semiconductor device surface processing method and a system thereof, which is capable of processing a device of 1 micron or less, or more preferably 0.5 micron or less.

What is claimed is:

1. A surface processing method of a sample having a mask layer without containing carbon as a major component formed on a substance to be processed, wherein said substance is at least one of a metal, semiconductor or insulator deposited on a silicon substrate, the method comprising steps of:
    installing said sample on a sample board in a vacuum container,
    generating a plasma that consists of a mixture of halogen gas and adhesive gas inside said vacuum container,
    applying a radio frequency bias voltage having a frequency ranging from 200 kHz to 20 MHz on said sample board, and controlling a periodic on-off of the radio frequency bias voltage with an on-off control frequency ranging from 100 Hz to 10 kHz.

2. A surface processing method according to claim 1, wherein the mask thereof is made of silicon nitride, silicon oxide or multilayer film thereof.

3. A surface processing method according to claim 1, wherein said halogen gas is a mixed gas of chlorine and BCl$_3$, and said adhesive gas is a carbon hydride.

4. A surface processing method according to claim 1, wherein said halogen gas is a mixed gas of chlorine and BCl$_3$, and said adhesive gas is gas prepared by diluting a carbon hydride with a noble gas.

5. A surface processing method according to claim 1, wherein said adhesive gas mixed with said halogen is nitrogen gas or a gas containing a nitrogen atom.

6. A surface processing method according to claim 1, wherein said halogen gas is chlorine, HBr or a mixed gas thereof, and said adhesive gas is oxygen gas or a gas containing an oxygen atom.

7. A surface processing method according to claim 1, wherein said halogen gas is fluorine gas or a gas containing a fluorine atom.

8. A surface processing method according to any one of claims 1, 2, and 3 to 7, wherein the controlling of the periodic on-off of the radio frequency bias voltage is characterized in that the percentage of on-period accounts for 5 to 60% in a cycle of on-off control of said radio frequency voltage.

9. A surface processing method according to any one of claims 1, 2, and 3 to 7 further characterized in that the mixing ratio of the adhesive gas to be mixed with said halogen ranges from 0.5% to 50%.

10. The surface processing method of claim 3, wherein the carbon hydride is methane, ethane or propane.

11. The surface processing method of claim 4, wherein the carbon hydride is methane, ethane or propane and the noble gas is argon.

12. A surface processing method of a sample having a metal to be processed and a mask layer that does not contain carbon as a major component formed on said metal; the method comprising steps of:
    installing said sample on a sample board in a vacuum container,
    generating a plasma that consists of a mixed gas of chlorine and BCl$_3$, and adhesive gas, wherein the adhesive gas is a carbon hydride, inside said vacuum container,
    applying a radio frequency bias voltage having a radio frequency ranging from 200 kHz to 20 MHz on said sample board, and
    controlling a periodic on-off of said radio frequency bias voltage with an on-off control frequency ranging from 100 Hz to 10 kHz.

13. A surface processing method according to claim 12, wherein said mask thereof is made of silicon nitride, silicon oxide or multilayer film thereof.

14. The surface processing method of claim 12, wherein the adhesive gas is methane, ethane or propane.

* * * * *